US009929095B2

(12) United States Patent
Singewar et al.

(10) Patent No.: US 9,929,095 B2
(45) Date of Patent: Mar. 27, 2018

(54) IO POWER BUS MESH STRUCTURE DESIGN

(71) Applicant: QUALCOMM Incorporated, San Diego, CA (US)

(72) Inventors: Rohit Vinod Singewar, Bangalore (IN); Roshan Thonse Shetty, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 38 days.

(21) Appl. No.: 14/535,309

(22) Filed: Nov. 6, 2014

(65) Prior Publication Data
US 2016/0133567 A1    May 12, 2016

(51) Int. Cl.
*H01L 23/528* (2006.01)
*H01L 23/00* (2006.01)

(52) U.S. Cl.
CPC .......... *H01L 23/5286* (2013.01); *H01L 24/05* (2013.01); *H01L 24/06* (2013.01); *H01L 2224/05553* (2013.01); *H01L 2224/06131* (2013.01); *H01L 2224/06135* (2013.01); *H01L 2924/14* (2013.01)

(58) Field of Classification Search
CPC ........................ H01L 23/5286; H01L 23/5283
See application file for complete search history.

(56) References Cited

U.S. PATENT DOCUMENTS

| | | | |
|---|---|---|---|
| 5,641,978 A * | 6/1997 | Jassowski | H01L 23/5286 257/203 |
| 5,923,089 A | 7/1999 | Yao et al. | |
| 6,586,828 B2 * | 7/2003 | Buffet | H01L 23/5286 257/207 |
| 6,925,627 B1 | 8/2005 | Longway et al. | |
| 7,080,341 B2 | 7/2006 | Eisenstadt et al. | |
| 7,554,133 B1 | 6/2009 | Ali et al. | |
| 8,115,325 B2 * | 2/2012 | Ishikawa | H01L 23/5283 257/203 |
| 8,595,661 B2 | 11/2013 | Kawa et al. | |

(Continued)

FOREIGN PATENT DOCUMENTS

| | | |
|---|---|---|
| JP | 2008252126 A | 10/2008 |
| JP | 2014033109 A | 2/2014 |

OTHER PUBLICATIONS

International Search Report and Written Opinion—PCT/US2015/055797—ISA/EPO—dated Mar. 15, 2016.

*Primary Examiner* — Robert Carpenter
(74) *Attorney, Agent, or Firm* — Arent Fox LLP

(57) ABSTRACT

A MOS device includes an IO pad ring. The MOS device includes a first IO pad located on a first side of the IO pad ring, and a second IO pad located on a second side of the IO pad ring. The first IO pad includes a metal x layer power interconnect extending in a first direction. The first metal x layer power interconnect is of a metal x layer. The second side is 90° from the first side. The second IO pad includes a second metal x layer power interconnect extending in the first direction. The second metal x layer power interconnect is of the metal x layer. The second IO pad may further include at least one of a metal x+1 layer power interconnect or a metal x−1 layer power interconnect that extends orthogonal to the second metal x layer power interconnect of the second IO pad.

8 Claims, 9 Drawing Sheets

(56) References Cited

U.S. PATENT DOCUMENTS

| | | |
|---|---|---|
| 2010/0123252 A1 | 5/2010 | Ushiyama |
| 2011/0089470 A1 | 4/2011 | Aoki |
| 2014/0239493 A1 | 8/2014 | Abematsu et al. |
| 2014/0245248 A1 | 8/2014 | Yang et al. |

\* cited by examiner

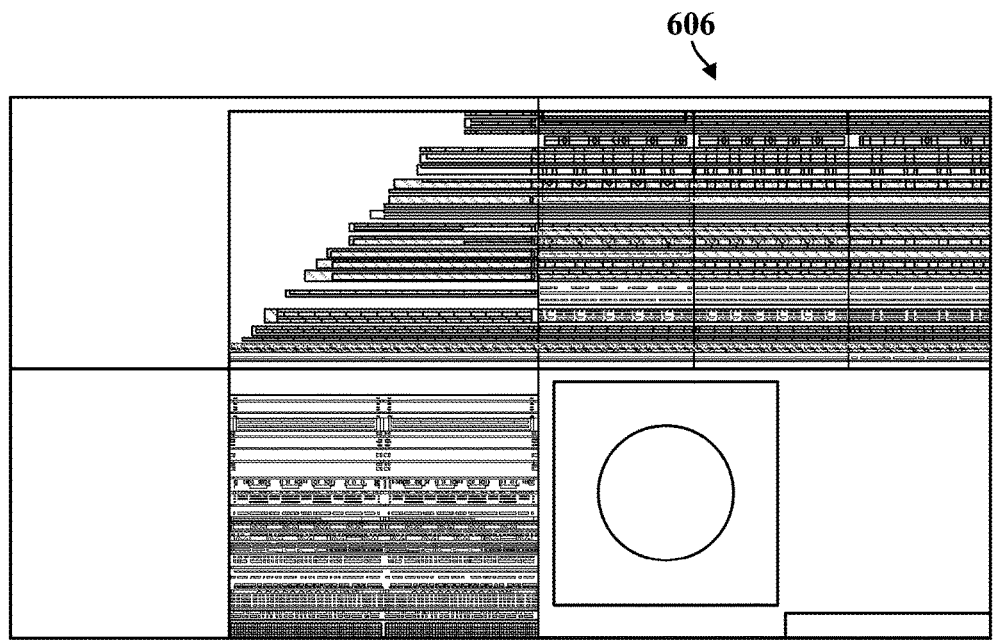
FIG. 6a
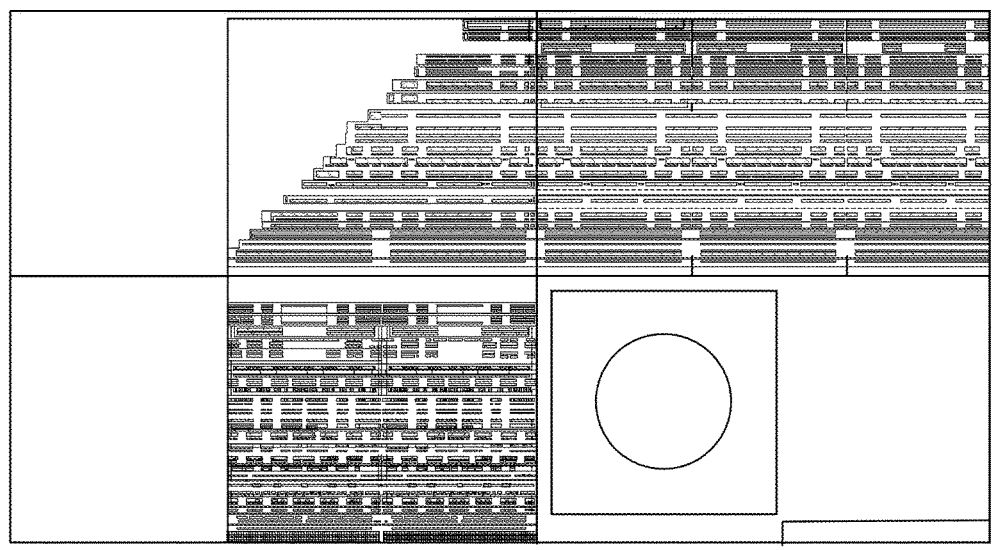
FIG. 6b
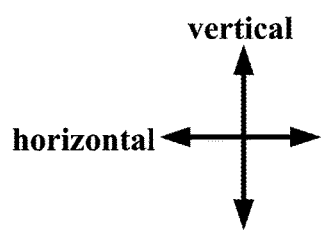

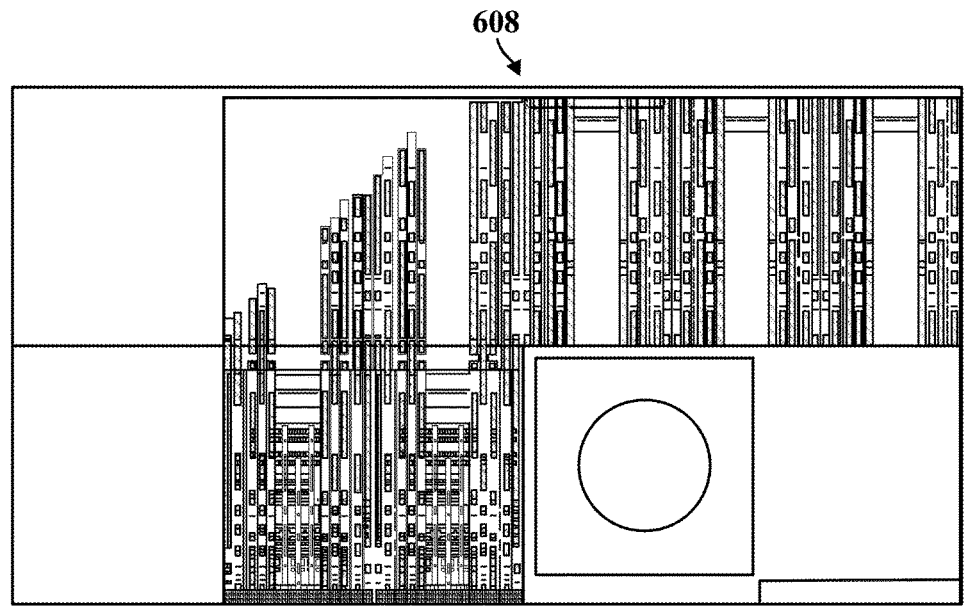
FIG. 6c
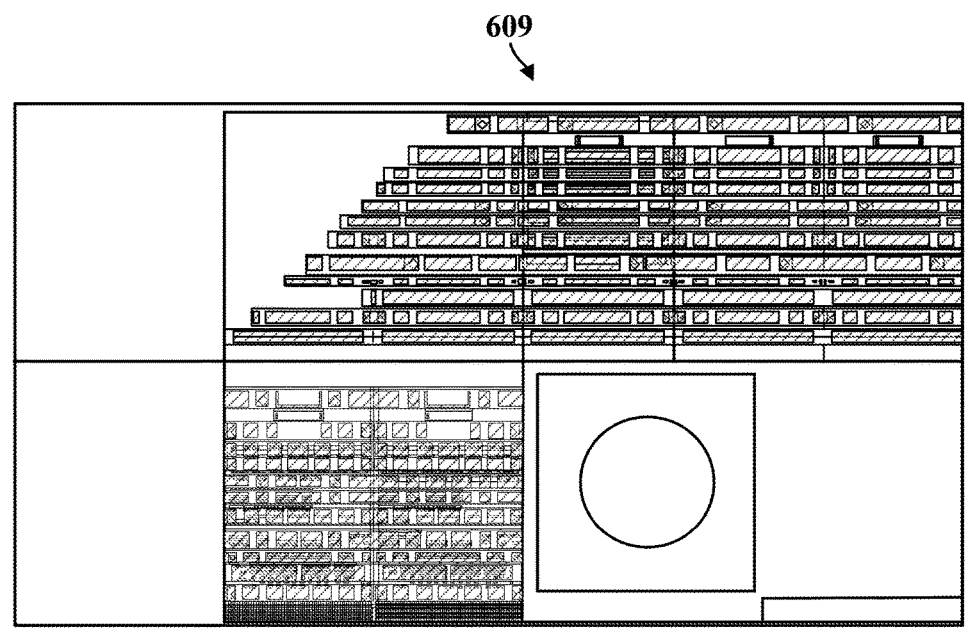
FIG. 6d
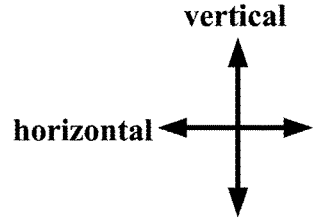

IO POWER BUS MESH STRUCTURE DESIGN

BACKGROUND

Field

The present disclosure relates generally to a metal oxide semiconductor (MOS) device, and more particularly, to an input/output (IO) power bus mesh structure design.

Background

An IO power bus is formed by stacking layers of metals of varying thickness and varying orientation, and is configured to deliver power to a plurality of IO pads of an integrated circuit. IO pads are intermediate structures that are used to transmit internal signals between a core of an integrated circuit/microchip and external pins of the chip package. IO power bus design may be impacted by IO pad design. As such, there is a need for new IO power bus designs that correspond with new IO pad designs.

SUMMARY

In an aspect of the disclosure, a MOS device includes an IO pad ring. The MOS device includes a first IO pad located on a first side of the IO pad ring, and a second IO pad located on a second side of the IO pad ring. The first IO pad includes a first metal x layer power interconnect extending in a first direction. The first metal x layer power interconnect is of a metal x layer. The second side is 90° from the first side. The second IO pad includes a second metal x layer power interconnect extending in the first direction. The second metal x layer power interconnect is of the metal x layer.

In an aspect of the disclosure, a method of operation of a metal oxide semiconductor device including an IO pad ring is provided. A first current flows through a first metal x layer power interconnect extending in a first direction within a first IO pad located on a first side of the IO pad ring. The first metal x layer power interconnect is of a metal x layer. A second current flows through a second metal x layer power interconnect extending in the first direction within a second IO pad located on a second side of the IO pad ring. The second side is 90° from the first side. The second metal x layer power interconnect is of the metal x layer.

BRIEF DESCRIPTION OF THE DRAWINGS

FIGS. 6a-6e are diagrams illustrating consecutive metal layers of a mesh-type IO power bus architecture at a corner of an IO pad ring according to a second configuration.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
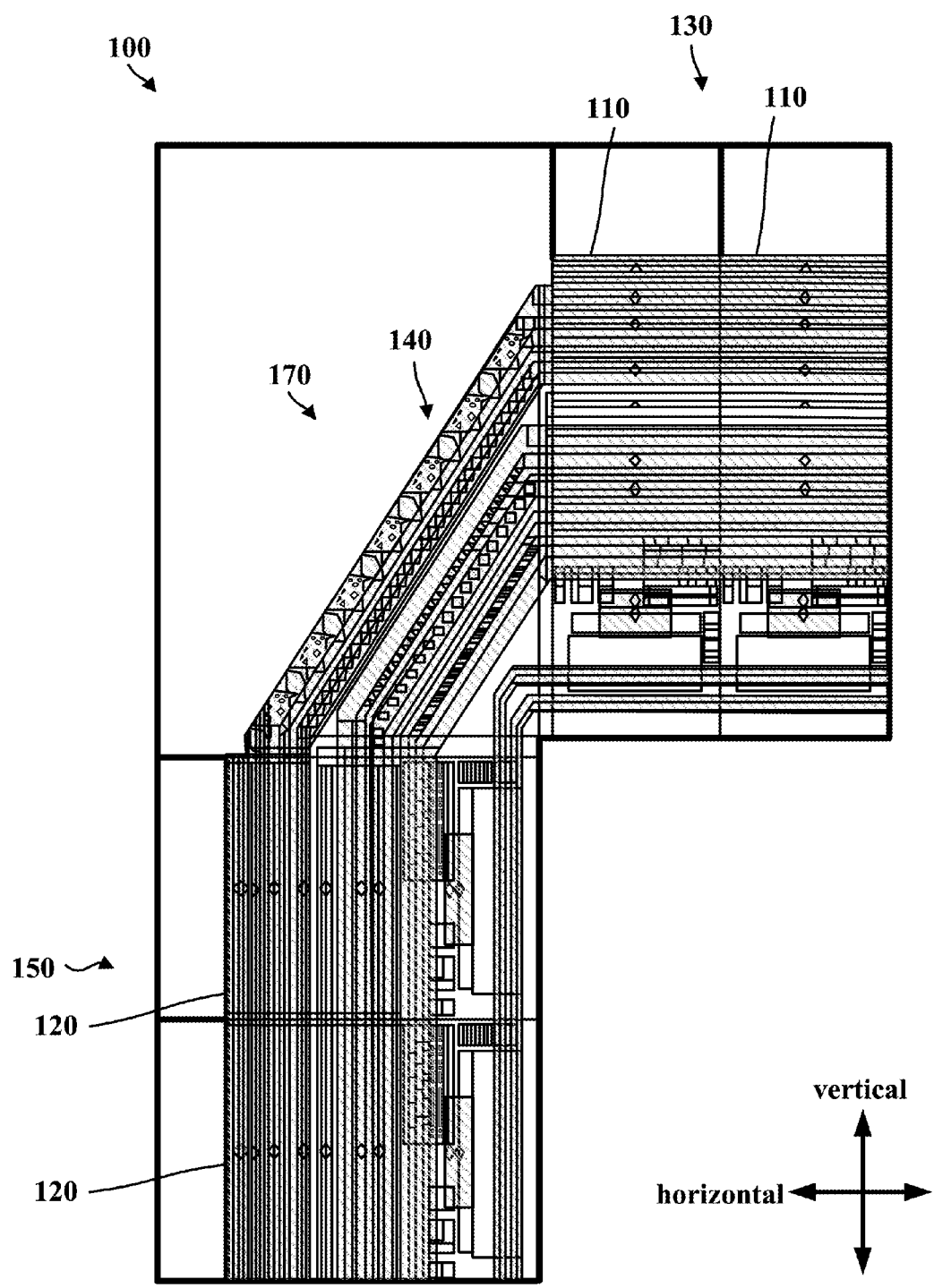
FIG. 1 is a diagram illustrating stitched-type IO power bus architecture.

FIG. 1 is a diagram 100 illustrating stitched-type IO power bus architecture. A stitched-type IO power bus architecture may be used in 28-nanometer and 20-nanometer manufacturing process technologies/nodes. With a stitched-type IO power bus architecture, various power interconnects (also referred to as power rails) of metal layers of the power bus are "stitched" together. The IO power bus is within IO pads. Two types of IO pads may be used in 28-nanometer system on chip (SoC) process technologies/nodes and 20-nanometer SoC process technologies/nodes. A first type of IO pad, referred to as a vertical IO pad 110, may include thin oxide transistor devices having gate interconnects (also referred to as POLY interconnects) oriented in a vertical direction (at pad level), and thick oxide transistor devices having gate interconnects also oriented in a vertical direction (at pad level). A second type of IO pad, referred to as a horizontal IO pad 120, may include thin oxide transistor devices having gate interconnects oriented in a horizontal direction (at pad level), and thick oxide transistor devices having gate interconnects oriented in a vertical direction (at pad level).

An IO pad ring 170 (also referred to as a pad frame) is the outer edge of a microchip. The pad ring 170 contains the IO pads of the microchip, including the vertical IO pads 110 and the horizontal IO pads 120. The IO pad ring 170 includes an IO power bus 140. The IO pad ring 170 may include an upper arm 130, a lower arm (not shown), a right arm (not shown), and a left arm 150 of IO pads 110, 120. A portion of the IO power bus 140 of the upper arm 130 and a portion of the IO power bus 140 of the left arm 150 may be connected together by an adjoining corner portion of the IO power bus 140.

The vertical IO pads 110 may be located in the upper arm 130 and in the lower arm. In either MOS technology, or in FINFET technology, in the upper arm 130, the vertical IO pads 110 may have a R0 orientation (not rotated), where "R0" refers to a standard cell orientation of the IO pad. The "0" in "R0" indicates that the IO pad is in a standard orientation of 0 degrees of rotation. In the lower arm, the vertical IO pads 110 may have an MX orientation, where "MX" refers to the standard orientation of the IO pad flipped along the X-axis. Alternatively, in either MOS or FINFET technology, the vertical IO pads 110 in the lower arm may have an R180 orientation, while the vertical IO pads 110 in the upper arm 130 may have an MY orientation, where "MY" refers to the standard orientation of the IO pad flipped along the Y-axis.

The horizontal IO pads 120 may be located in the left arm 150 and in the right arm. In MOS technology, when the IO pads 110 in the upper and lower arms are respectively of R0 orientation and MX orientation, the horizontal IO pads 120 in the left arm 150 may have an R90 orientation, while in the right arm, the horizontal IO pads 120 may have an R270 orientation. Alternatively, when the vertical IO pads 110 in the upper and lower arms are respectively of MY orientation and R180 orientation in MOS technology, the horizontal IO pads 120 in the left arm may have an MYR90 orientation, while the horizontal IO pads 120 in the right arm have an MXR90 orientation.

In FINFET technology, when the vertical IO pads 110 in the upper and lower arms are respectively of R0 orientation and MX orientation, the horizontal IO pads 120 in the left arm 150 may have an MY orientation, while the horizontal IO pads 120 in the right arm may have an R0 orientation. Alternatively, when the IO pads 110 in the upper and lower arms are respectively of MY orientation and R180 orientation in FINFET technology, the IO pads 120 in the left arm 150 may have an R0/MX orientation, while the IO pads 120 in the right arm have an MY orientation.

After rotation (at chip level), the vertical IO pads 110 have thin and thick oxide transistor devices with gate interconnects extending vertically, while the horizontal IO pads 120 have thin oxide transistor devices with gate interconnects extending vertically and thick oxide transistor devices with gate interconnects extending horizontally. The vertical and horizontal directions are shown in FIG. 1, and are labeled with respect to the orientation of the IO pad ring 170 illustrated in FIG. 1.

Timing variation in the stitched-type IO power bus architecture for both vertical IO pads 110 and horizontal IO pads 120 may be about 5% or less, which may be acceptable for operation of the microchip. The timing variation between the vertical IO pads 110 and the horizontal IO pads 120 is due to the different layout design of the vertical IO pads 110 and the horizontal IO pads 120. As discussed supra, at pad level, the vertical IO pads 110 have thin and thick oxide gate interconnects extending in the vertical direction, while the horizontal IO pads 120 have thin and thick oxide gate interconnects extending in the horizontal and vertical directions, respectively. Accordingly, with different orientations of the thick oxide transistor devices, the vertical IO pads 110 and the horizontal IO pads 120 have different layouts, and therefore have slightly different timing from each other.

Figure 2:
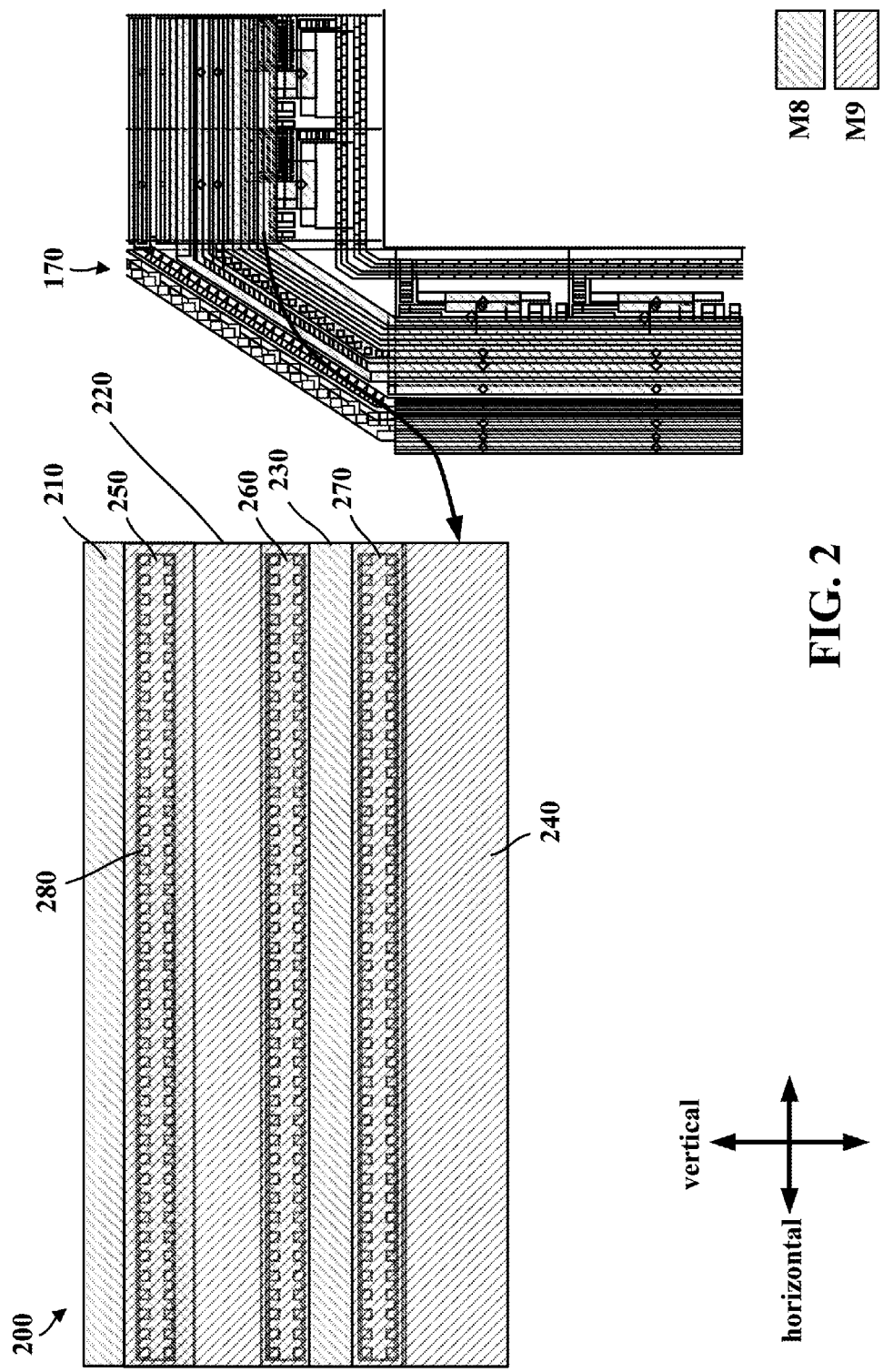
FIG. 2 is a diagram illustrating a close-up of two adjacent metal layers of the stitched-type IO power bus architecture shown in FIG. 1.

FIG. 2 is a diagram 200 illustrating a close-up of two adjacent metal layers of the stitched-type IO power bus architecture of FIG. 1. The stitched-type IO power bus structure of the IO pad ring 170 may be achieved by partially overlapping corresponding portions of adjacent metal layer interconnects that extend in the same direction. For example, metal layer M8 interconnects 210, 230 and metal layer M9 interconnects 220, 240 may extend in the same direction, and overlapping portions of the metal layer M8 interconnects 210, 230 and the metal layer M9 interconnects 220, 240 may be stitched together. Metal layer M9 interconnects 220, 240 are directly above metal layer M8 interconnects 210, 230. The metal layer M8 interconnects 210, 230 and the metal layer M9 interconnects 220, 240 are electrically connected by vias 280 that provide the stitching 250, 260, 270 of the metal layer M8 interconnects 210, 230 to the metal layer M9 interconnects 220, 240. Other adjacent metal layer interconnects (e.g., metal layer M7 interconnects, and metal layer M6 interconnects) that extend in the same direction as the metal layer M8 interconnects 210, 230 and the metal layer M9 interconnects 220, 240 may be stitched together to adjacent metal layer interconnects such that all of the stitched metal layer interconnects are electrically connected through the stitching to form a stitched-type IO power bus.

With multiple gate field effect transistor (MuGFET) (e.g., FinFET) process technologies/nodes (e.g., 16-nanometer and 14-nanometer manufacturing process technology/ nodes), thin oxide and thick oxide devices need to have gate interconnects extending in the same direction on the chip level. The aforementioned vertical IO pads 110 and horizontal IO pads 120 therefore cannot both be used. Generating a vertical IO pad with a vertical orientation of the thin and thick oxide device gate interconnects (where the gate interconnects are oriented vertically based on the R0 and MY orientations), and a horizontal IO pad with a horizontal orientation of the thin and thick oxide device interconnects (where the gate interconnects are oriented vertically based on the R90 and R270 orientations) results in a timing variation of greater than 7% between the vertical IO pad and the horizontal IO pad. Accordingly, the same IO pad design, each with gate interconnects oriented vertically, may be used without rotation in the IO pad ring. The stitched-type IO power bus may not be used within the IO pad ring when the same IO pad design is used in the IO pad ring without rotation. An exemplary mesh-type IO power bus is provided infra for an IO pad ring with the same IO pad design used without rotation.

Figure 3:
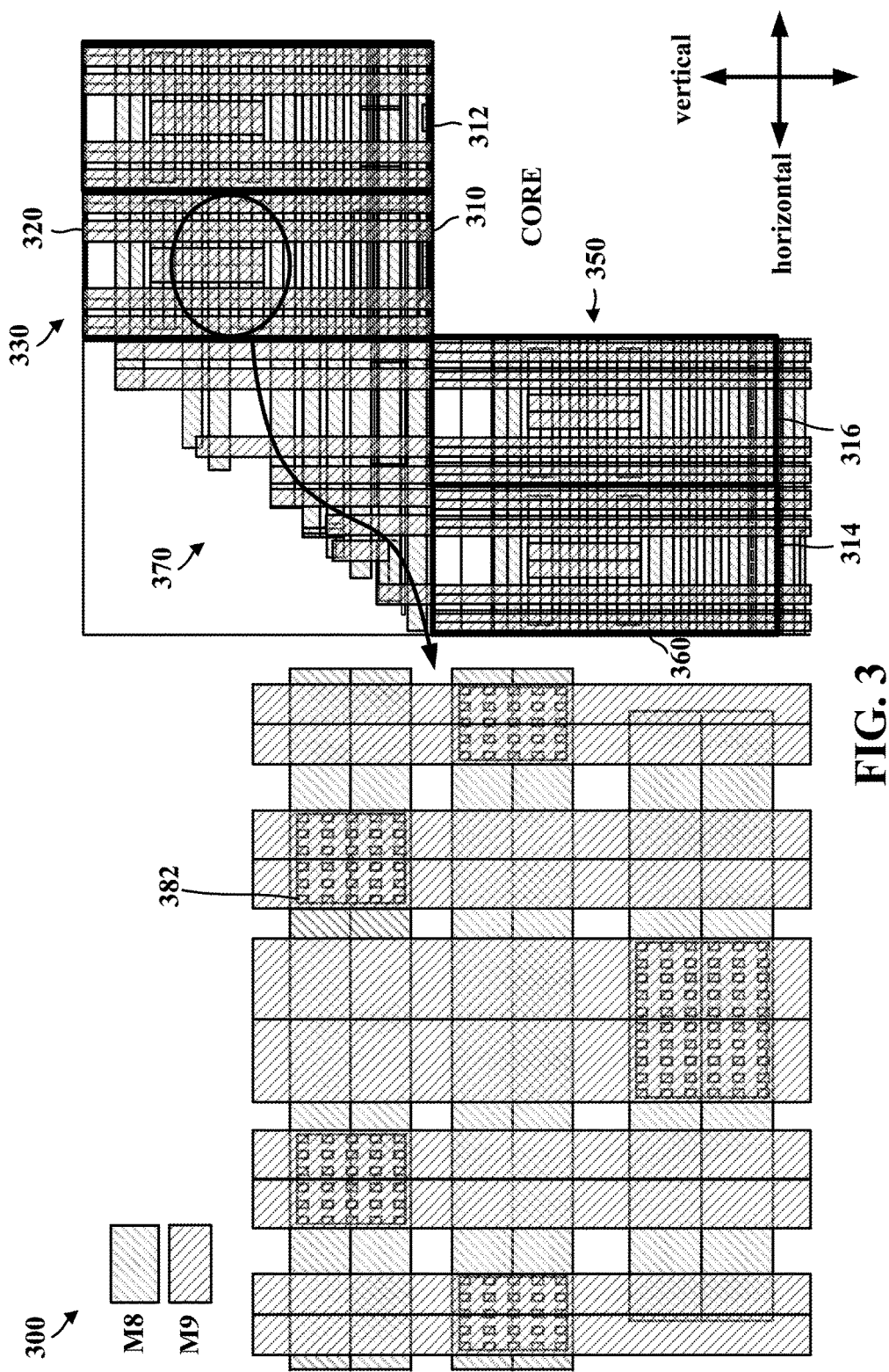
FIG. 3 is a diagram illustrating an exemplary mesh-type IO power bus architecture according to a first configuration.

FIG. 3 is a diagram 300 illustrating an exemplary mesh-type IO power bus architecture according to a first configuration. As shown in FIG. 3, the same IO pad design is used for the IO pads 310, 312, 314, 316 at all arms of an IO pad ring 370 (e.g., the top arm 330 and the left arm 350). The IO pads 310, 312, 314, 316 have an identical layout design. In the top arm 330, each IO pad 310, 312 is located between a core of the IO pad ring 370 and an external outer edge 320 of the top arm 330. In the left arm 350, pairs of IO pads 314, 316 are located between a core of the IO pad ring 370 and an external outer edge 360 of the left arm 350. Each IO pad 310, 312, 314, 316 includes a portion of a mesh-type IO power bus in which adjacent metal layers used for the power bus extend orthogonally to each other, and are connected together at overlapping portions. For example, metal layer M6 interconnects and metal layer M8 interconnects may extend in a horizontal direction, and metal layer M7 interconnects and metal layer M9 interconnects may extend in a vertical direction, with via connections between each of the adjacent metal layer interconnects such that the metal layer M6, M7, M8, and M9 interconnects are all electrically connected. As shown in FIG. 3, metal layer M9 interconnects extend vertically and metal layer M8 interconnects extend horizontally. The metal layer M8 interconnects and the metal layer M9 interconnects are connected together at overlapping portions with vias 382 to form a mesh-type IO power bus.

The metal layer power interconnects in the IO pads 314, 316 are connected to the metal layer power interconnects in the IO pad 310 at a corner of the IO pad ring 370. For example, metal layer M7 interconnects and metal layer M9 interconnects from the IO pads 314, 316 extend vertically to the corner of the IO pad ring 370, and metal layer M6 interconnects and metal layer M8 interconnects from the IO pad 310 extend horizontally to the corner of the IO pad ring 370. The metal layer M6, M7, M8, and M9 interconnects are connected together with vias at overlapping portions of adjacent metal layer interconnects.

Figure 4:
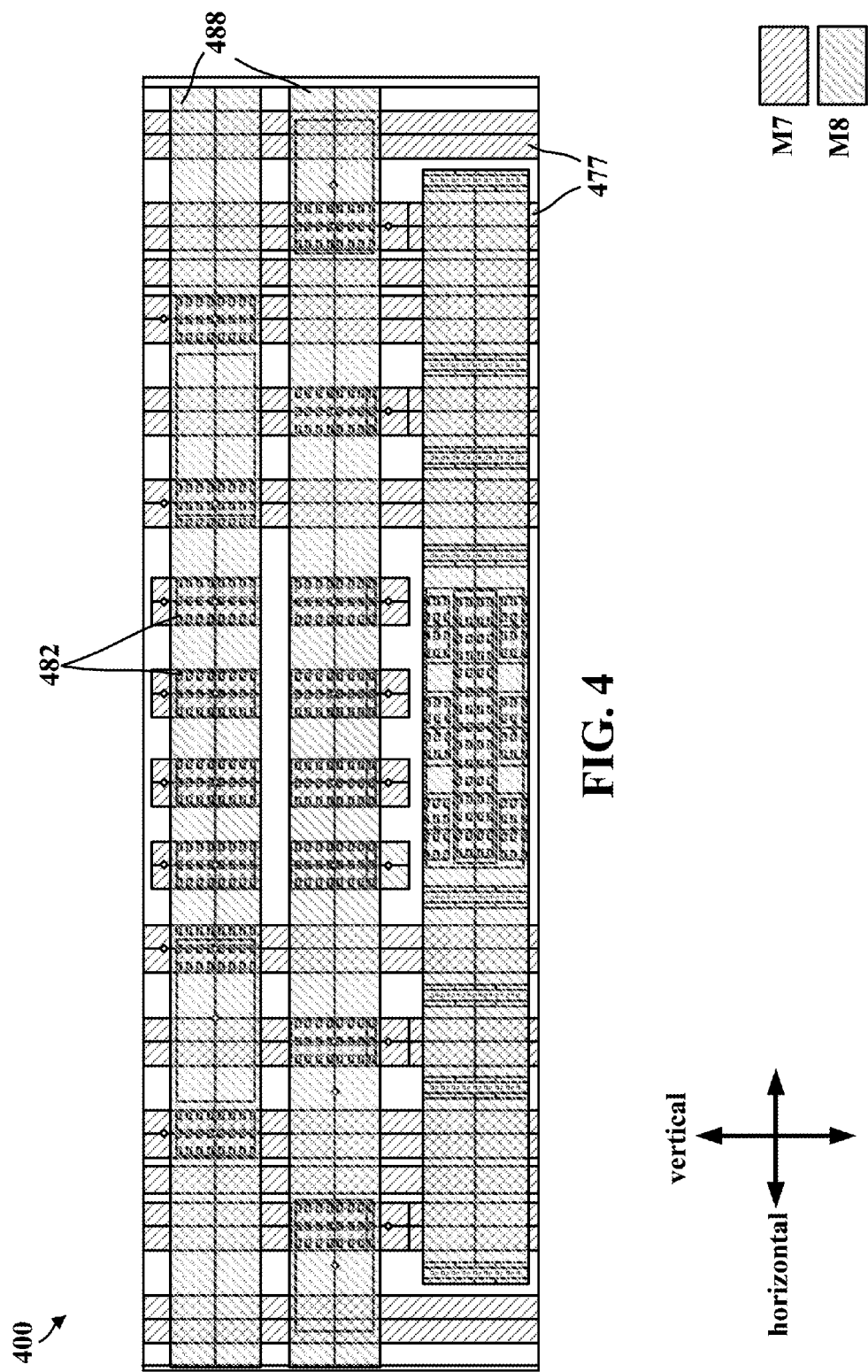
FIG. 4 is a diagram illustrating a close-up of metal layers M7 and M8 of the mesh-type IO power bus architecture shown in FIG. 3.

FIG. 4 is a diagram 400 illustrating a close-up of metal layer M7 interconnects and metal layer M8 interconnects of the mesh-type IO power bus architecture shown in FIG. 3. As shown in FIG. 4, the metal layer M7 interconnects 477 extend vertically and the metal layer M8 interconnects 488 extend horizontally. The metal layer M7 interconnects 477 are connected to the metal layer M8 interconnects 488 by vias 482 between overlapping portions of the adjacent interconnects. Each of the metal layer M7, M8, M9 interconnects (see FIGS. 3, 4) are electrically connected together to form a mesh-type IO power bus of the IO pad ring 370. The mesh-type IO power bus may further include metal layer M6 interconnects. The metal layer M6 interconnects may extend horizontally and orthogonally to the metal layer M7 interconnects. The metal layer M6 interconnects and the metal layer M7 interconnects may be connected together with vias between overlapping portions.

Figure 5:
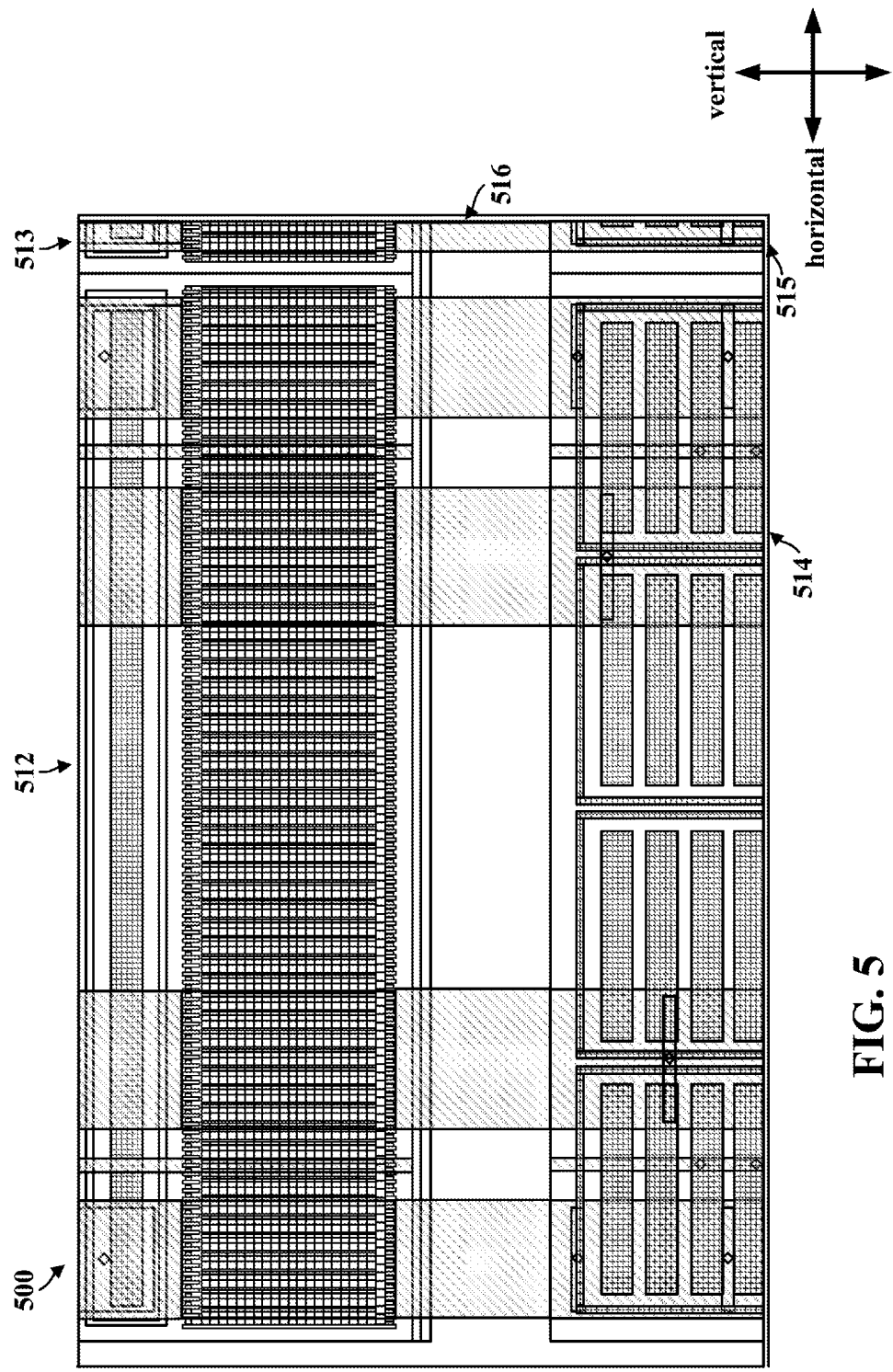
FIG. 5 is a diagram illustrating a close-up of a portion of four IO pads located on a left arm of an IO pad ring.
Figure 6E:
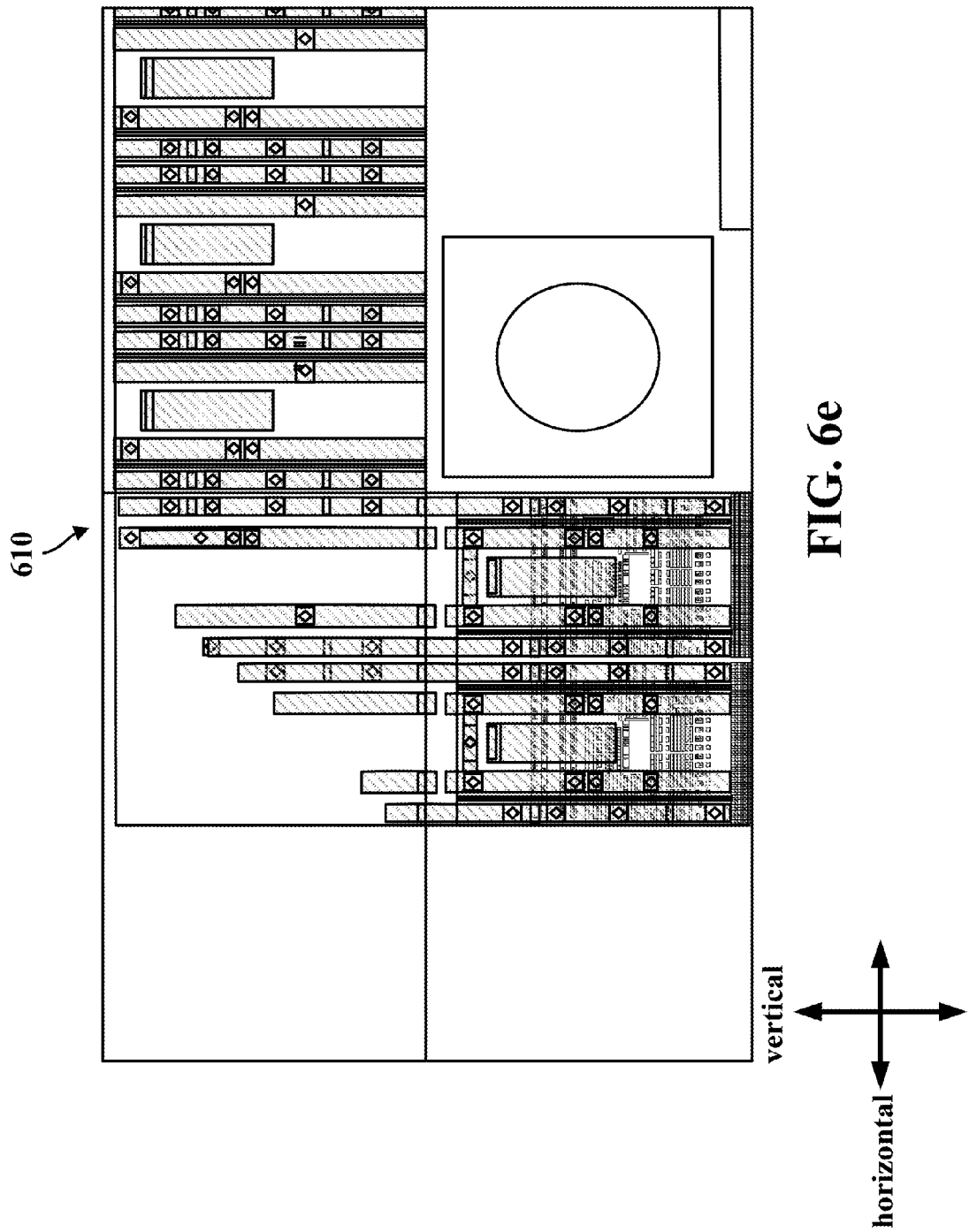

FIG. 5 is a diagram illustrating a close-up of a portion of four IO pads 512, 513, 514, 515 located on a left arm of an IO pad ring. Because some IO pads 512, 514 are adjacent only the outer edge of the chip/IO pad ring, while other IO pads 513, 515 are adjacent only the inner edge of the chip/IO pad ring, the IO pads 512, 513 are spaced from the IO pads 514, 515 to create a spacing/channel/alleyway 516 to enable routing between the outer IO pads 512, 514 and the core of the chip. Accordingly, the channel/spacing 516 allows signals to be passed between the core of the chip and the outer IO pads 512, 514. Assuming metal layer M6 is the bottommost metal layer of the IO power bus, routing in the alleyway may include one or more of lower metal layers M1 to M5.

FIGS. 6a-6e are diagrams illustrating consecutive metal layers of a mesh-type IO power bus architecture at a corner of an IO pad ring according to a second configuration. FIGS. 6a-6e depict metal layers M6-M10, respectively. As can be seen in FIGS. 6a-6e, metal layers M6 606, M7 607, and M9 609 extend in a horizontal direction, while metal layers M8 608 and M10 610 extend in a vertical direction. That is, the power interconnects/metal strips that constitute the metal layers M6 606, M7 607, and M9 609 extend lengthwise in a horizontal direction, while the power interconnects/metal strips that constitute the metal layers M8 608 and M10 610 extend lengthwise in a vertical direction. Respective portions of the metal layers M6 and M7 partially overlap and are electrically connected in a manner similar to the stitched-type architecture described supra with respect to FIG. 1 and FIG. 2. Furthermore, although metal layers M6-M10 are shown, different metal layers, additional metal layers, or as few as two metal layers, may be used to construct an IO power bus in other configurations.

Each metal layer is electrically connected to one or both of its adjacent metal layers through multiple physical via connections. However, unlike the stitched-type connections of the adjacent metal layer M6 and M7 interconnects, the adjacent metal layer M7 to M10 interconnects extend orthogonally to adjacent metal layer interconnects. For example, metal layer M8 interconnects 608 extend in a vertical direction, and are physically and electrically connected to metal layer M7 607 interconnects and to metal layer M9 interconnects 609, which are respectively directly below and above metal layer M8 608, and which extend in a horizontal direction. Furthermore, metal layer M8 interconnects 608 extend in a vertical direction past the topmost IO pad of the left arm of the IO pad ring to be physically connected to metal layer M7 interconnects 607 and/or metal layer M9 interconnects 609, which extend to the left of the leftmost IO pad of the top arm of the IO pad ring. Accordingly, power interconnects of the metal layer M8 interconnects connect at a 90-degree angle to the power interconnects of the metal layer M7 interconnects and/or the metal layer M9 interconnects at a corner of the IO pad ring.

Referring again to FIG. 3 and FIG. 4, a MOS device including an IO pad ring 370 includes a first IO pad 310 located on a first side 330 of the IO pad ring 370. The first IO pad 310 includes a first metal x layer power interconnect (e.g., metal layer M8 interconnect) extending in a first direction (e.g., horizontally). The first metal x layer power interconnect is of a metal x layer (e.g., metal M8 layer). A second IO pad 314 is located on a second side 350 of the IO pad ring. The second side 350 is 90° from the first side 330. The second IO pad 314 includes a second metal x layer power interconnect (e.g., metal layer M8 interconnect) extending in the first direction. The second metal x layer power interconnect is of the metal x layer (e.g., metal M8 layer).

The second IO pad 314 may further include at least one of a metal x+1 layer power interconnect (e.g., metal layer M9 interconnect) or a metal x−1 layer power interconnect (e.g., metal layer M7 interconnect) that extends orthogonally to the second metal x layer power interconnect (e.g., metal layer M8 interconnect) of the second IO pad 314. The second metal x layer power interconnect of the second IO pad 314 may be electrically connected to the at least one of the metal x+1 layer power interconnect or the metal x−1 layer power interconnect of the second IO pad 314. The at least one of the metal x+1 layer power interconnect or the metal x−1 layer power interconnect of the second IO pad 314 may extend along the second side 350. The first metal x layer power interconnect of the first IO pad 310 may extend along the first side 330. The at least one of the metal x+1 layer power interconnect or the metal x−1 layer power interconnect of the second IO pad 314 and the first metal x layer power interconnect of the first IO pad 310 may connect at a corner of the first side 330 and the second side 350 (e.g., at least one of the metal layer M9 power interconnect or the metal layer M7 power interconnect of the second IO pad 314 and the metal layer M8 power interconnect of the first IO pad 310 may connect at a corner of the first side 330 and the second side 350). The connection between the at least one of the metal x+1 layer power interconnect or the metal x−1 layer power interconnect of the second IO pad 314 and the first metal x layer power interconnect of the first IO pad 310 may form a 90° connection. The first IO pad 310 and the second IO pad 314 may be identical and may have a same orientation (i.e., not rotated) within the IO pad ring 370. The MOS device may further include a plurality of additional IO pads 312, 316. The additional IO pads 312, 316 may be located on each side of the IO pad ring including the first side 330 and the second side 350. Each of the first IO pad 310, the second IO pad 314, and the additional IO pads 312, 316 may be identical and may have a same orientation within the IO pad ring 370.

Referring to FIG. 5, assume the second IO pad 314 is the IO pad 512 and the additional IO pad 316 is a third IO pad 513. The MOS device may further include the third IO pad 513, a fourth IO pad 514, and a fifth IO pad 515 each located on the second side 350 of the IO pad ring 370. The third IO pad 513 may be located between the second IO pad 512 and an inner edge of the IO pad ring 370. The fourth IO pad 514 may be located adjacent the second IO pad 512. The fifth IO pad 515 may be located between the fourth IO pad 514 and the inside of the IO pad ring 370 and may be located adjacent the third IO pad 513. The second IO pad 512 and the third IO pad 513 may be spaced from the fourth IO pad 514 and the fifth IO pad 515 to allow for metal interconnect routing within the spacing 516. The MOS device may further include interconnects extending from a core of the MOS device and within the spacing 516. The MOS device may further include a metal y layer power interconnect (e.g., metal layer M6 interconnect) extending in the second IO pad 314. The metal y layer and the metal x layer may be metal layers of a power bus. The metal y layer may be a lowest metal layer of the metal layers of the power bus. The interconnect extending from the core of the MOS device within the spacing 516 may include a metal z layer interconnect, where z is greater than or equal to 1 and less than or equal to (y−1) (e.g., 5 with y=6), and y is less than or equal to (x−2) (e.g., 6 with x=8) (e.g., the interconnect extending from the core of the MOS device within the spacing 516 may include a metal z layer interconnect, where z is greater than or equal to 1 and less than or equal to 5).

Figure 7:
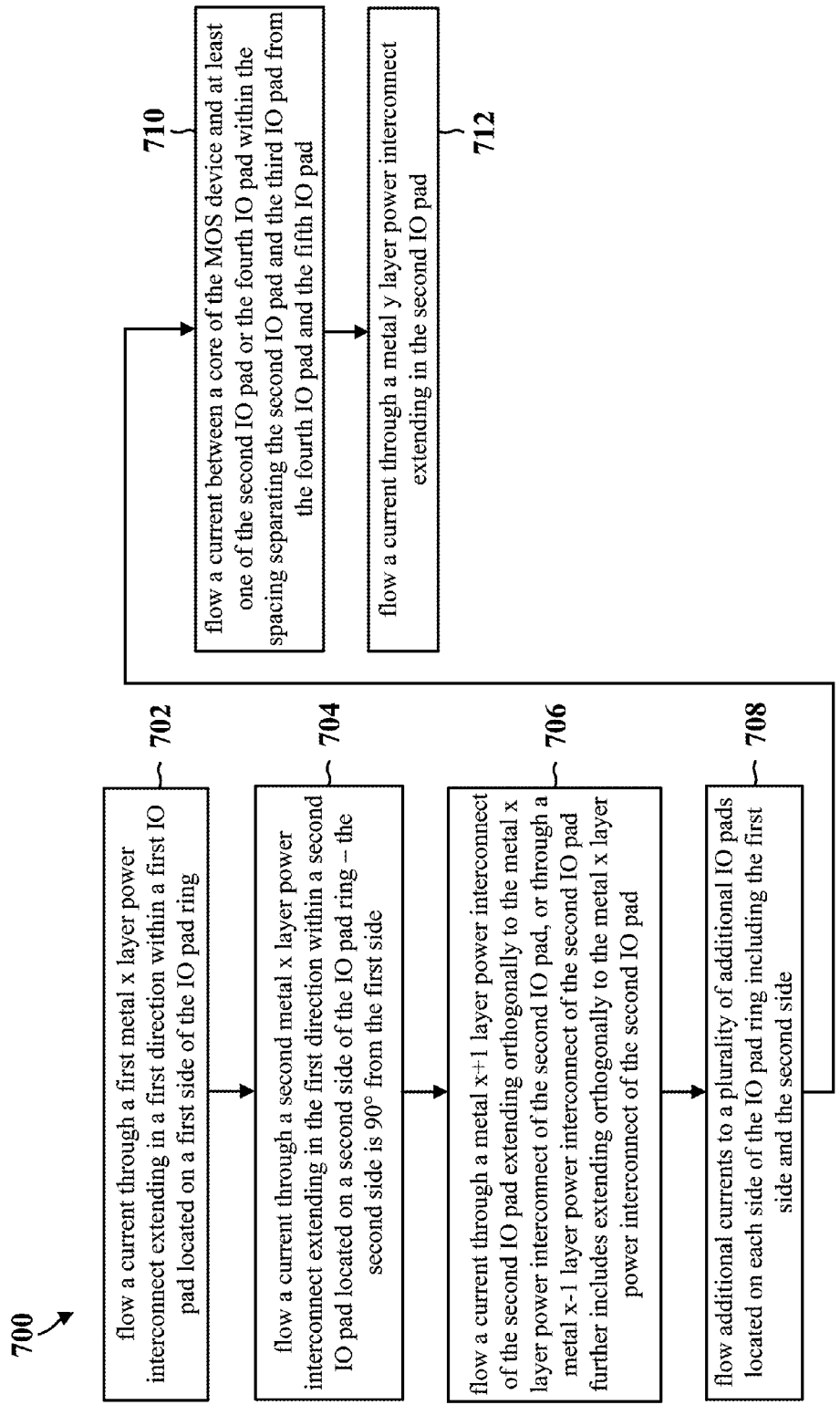
FIG. 7 is a flow chart of an exemplary method of a MOS device.

FIG. 7 is a flow chart 700 of an exemplary method of a MOS device including an IO pad ring, such as the MOS device including the mesh-type IO power bus architecture shown in FIG. 3. At 702, a current flows through a first metal x layer power interconnect extending in a first direction within a first IO pad located on a first side of the IO pad ring. For example, referring to FIG. 3, a current may flow through a metal layer M8 power interconnect extending in a first direction (e.g., horizontal direction) within a first IO pad 310 located on a first side 330 of the IO pad ring 370. At 704, a current flows through a second metal x layer power interconnect extending in the first direction within a second IO pad located on a second side of the IO pad ring. For example, referring to FIG. 3, a current may flow through a metal layer M8 power interconnect extending in the first direction within a second IO pad 314 located on a second side 350 of the IO pad ring 370. The second side 350 is 90° from the first side 330. At 706, a current flows through a metal x+1 layer power interconnect of the second IO pad extending orthogonally to the second metal x layer power interconnect of the second IO pad, or through a metal x−1 layer power interconnect of the second IO pad extending orthogonally to the second metal x layer power interconnect of the second IO pad. For example, referring to FIG. 3, a current may flow through a metal layer M9 power interconnect of the second IO pad 314 extending orthogonally to the metal layer M8 power interconnect of the second IO pad 314, or through a metal layer M7 power interconnect of the second IO pad 314 extending orthogonally to the metal layer M8 power interconnect of the second IO pad 314. The second metal x layer power interconnect of the second IO pad may be electrically connected to at least one of the metal x+1 layer power interconnect or the metal x−1 layer power interconnect of the second IO pad. At least one of the metal x+1 layer power interconnect or the metal x−1 layer power interconnect of the second IO pad may extend along the second side. The first metal x layer power interconnect of the first IO pad may extend along the first side. The at least one of the metal x+1 layer power interconnect or the metal x−1 layer power interconnect of the second IO pad and the first metal x layer power interconnect of the first IO pad may connect at a corner of the first side and the second side. The connection between the at least one of the metal x+1 layer power interconnect or the metal x−1 layer power interconnect of the second IO pad and the first metal x layer power interconnect of the first IO pad may form a 90° connection. The first IO pad and the second IO pad may be identical and have a same orientation within the IO pad ring.

At 708, additional currents may flow to a plurality of additional IO pads located on each side of the IO pad ring including the first side and the second side. Each of the first IO pad, the second IO pad, and the additional IO pads may be identical and may have a same orientation within the IO pad ring. For example, referring to FIG. 3, additional currents may flow to a plurality of additional IO pads 312, 316 located on each side of the IO pad ring 370 including the first side 330 and the second side 350. Each of the first IO pad 310, the second IO pad 314, and the additional IO pads 312, 316 is identical and has a same orientation within the IO pad ring 370.

A third IO pad, a fourth IO pad, and a fifth IO pad may each be located on the second side of the IO pad ring. The third IO pad may be located between the second IO pad and an inner edge of the IO pad ring. The fourth IO pad may be located adjacent the second IO pad. The fifth IO pad may be located between the fourth IO pad and the inside of the IO pad ring. The fifth IO pad may be located adjacent the third IO pad. The second IO pad and the third IO pad may be spaced from the fourth IO pad and the fifth IO pad to allow for metal interconnect routing within the spacing. At 710, a current may flow between a core of the MOS device and at least one of the second IO pad or the fourth IO pad within the spacing separating the second IO pad and the third IO pad from the fourth IO pad and the fifth IO pad. For example, referring to FIG. 5, a current may flow between a core of the MOS device and at least one of the second IO pad 512 or the fourth IO pad 514 within the spacing 516 separating the second IO pad 512 and the third IO pad 513 from the fourth IO pad 514 and the fifth IO pad 515. At 712, a current may flow through a metal y layer power interconnect extending in the second IO pad. The metal y layer and the metal x layer may include metal layers of a power bus. The metal y layer may be a lowest metal layer of the metal layers of the power bus. The interconnect extending from the core of the MOS device within the spacing may include a metal z layer interconnect, where z is greater than or equal to 1 and less than or equal to (y−1), and y is less than or equal to (x−2). For example, referring to FIG. 3, a current may flow through a metal y layer power interconnect extending in the second IO pad 314. The metal y layer and the metal x layer may include metal layers of a power bus. The metal y layer may be a lowest metal layer of the metal layers of the power bus. The interconnect extending from the core of the MOS device within the spacing may include a metal z layer interconnect, where z is greater than or equal to 1 and less than or equal to (y−1) (e.g., 5 when y=6) and y is less than or equal to (x−2) (e.g., 6 when x=8).

In one configuration, a MOS device includes an IO pad ring. The MOS device includes means for flowing a first current through a first metal x layer power interconnect (e.g., the metal layer M8 power interconnect) extending in a first direction within a first IO pad located on a first side of the IO pad ring. The first metal x layer power interconnect is of a metal x layer. The MOS device further includes means for flowing a second current through a second metal x layer power interconnect (e.g., metal layer M8 power interconnect) extending in the first direction within a second IO pad located on a second side of the IO pad ring. The second side is 90° from the first side. The second metal x layer power interconnect is of the metal x layer. The MOS device may further include means for flowing a third current through a metal x+1 layer power interconnect (e.g., metal layer M9 power interconnect) of the second IO pad extending orthogonally to the second metal x layer power interconnect of the second IO pad, or through a metal x−1 layer power interconnect (e.g., metal layer M7 power interconnect) of the second IO pad extending orthogonally to the second metal x layer power interconnect of the second IO pad. The second metal x layer power interconnect of the second IO pad may be electrically connected to at least one of the metal x+1 layer power interconnect or the metal x−1 layer power interconnect of the second IO pad. At least one of the metal x+1 layer power interconnect or the metal x−1 layer power interconnect of the second IO pad may extend along the second side. The first metal x layer power interconnect of the first IO pad may extend along the first side. The at least one of the metal x+1 layer power interconnect or the metal x−1 layer power interconnect of the second IO pad and the first metal x layer power interconnect of the first IO pad may connect at a corner of the first side and the second side. The connection between the at least one of the metal x+1 layer power interconnect or the metal x−1 layer power interconnect of the second IO pad and the first metal x layer power interconnect of the first IO pad may form a 90° connection. The first IO pad and the second IO pad may be identical and may have a same orientation within the IO pad ring. The MOS device may further include means for flowing additional currents to a plurality of additional IO pads located on each side of the IO pad ring including the first side and the second side. Each of the first IO pad, the second IO pad, and the additional IO pads may be identical and may have a same orientation within the IO pad ring. A third IO pad, a fourth IO pad, and a fifth IO pad may be each located on the second side of the IO pad ring. The third IO pad may be located between the second IO pad and an inner edge of the IO pad ring. The fourth IO pad may be located adjacent the second IO pad. The fifth IO pad may be located between the fourth IO pad and the inside of the IO pad ring and may be located adjacent the third IO pad. The second IO pad and the third IO pad may be spaced from the fourth IO pad and the fifth IO pad to allow for metal interconnect routing within the spacing. The MOS device may further include means for flowing a third current between a core of the MOS device and at least one of the second IO pad or the fourth IO pad within the spacing separating the second IO pad and the third IO pad from the fourth IO pad and the fifth IO pad. The MOS device may further include means for flowing a fourth current through a metal y layer power interconnect extending in the second IO pad. The metal y layer and the metal x layer may be metal layers of a power bus. The metal y layer may be a lowest metal layer of the metal layers of the power bus. The interconnect extending from the core of the MOS device within the spacing may include a metal z layer interconnect, where z is greater than or equal to 1 and less than or equal to (y−1), and y is less than or equal to (x−2).

Two configurations for a mesh-type IO power bus are described supra. In a first configuration, M6 and M8 metal layer interconnects extend horizontally, and M7 and M9 metal layer interconnects extend vertically. The M6, M7, M8, and M9 metal layer interconnects are connected in a mesh, with adjacent interconnects being connected in overlapping portions by vias. In a second configuration, M6, M7, and M9 metal layer interconnects extend horizontally, and M8 and M10 metal layer interconnects extend vertically. The M7, M8, M9, and M10 metal layer interconnects are connected in a mesh, with adjacent interconnects being connected in overlapping portions by vias. The M6 metal layer interconnects may be connected to the M7 metal layer interconnects through a stitched-type via connection. The mesh-type IO power bus may be used when each of the IO pads are identical. Overall layout effort and characterization effort associated with design of the microchip are reduced by using IO pads of a single design and of a single orientation, with each IO pad having thin and thick oxide transistor gate interconnects extending in the same direction.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A metal oxide semiconductor (MOS) device including an input/output (TO) pad ring located between a core of the MOS device and external pins of the MOS device, the MOS device comprising:
    a first IO pad configured to transmit signals between the core and the external pins of the MOS device and located on a first side of the IO pad ring, the first IO pad being a standard cell including internal to the standard cell a first power mesh including a first metal x layer power interconnect extending in a first direction, the first metal x layer power interconnect being of a metal x layer; and
    a second IO pad configured to transmit signals between the core and the external pins of the MOS device and located on a second side of the IO pad ring, the second side being 90° from the first side, the second IO pad being a standard cell including internal to the standard cell a second power mesh including a second metal x layer power interconnect extending in the first direction, the second metal x layer power interconnect being of the metal x layer,
    wherein the first metal x layer power interconnect on the metal x layer in the first power mesh of the first IO pad on the first side of the IO pad ring is parallel to the second metal x layer power interconnect on a same metal x layer in the second power mesh of the second IO pad on the second side of the IO pad ring 90° from the first side of the IO pad ring.

2. The MOS device of claim 1, wherein the second IO pad further includes at least one of a metal x+1 layer power interconnect or a metal x−1 layer power interconnect that extends orthogonal to the second metal x layer power interconnect of the second IO pad.

3. The MOS device of claim 2, wherein the second metal x layer power interconnect of the second IO pad is electrically connected to the at least one of the metal x+1 layer power interconnect or the metal x−1 layer power interconnect of the second IO pad.

4. The MOS device of claim 2, wherein:
   the at least one of the metal x+1 layer power interconnect or the metal x−1 layer power interconnect of the second IO pad extends along the second side;
   the first metal x layer power interconnect of the first IO pad extends along the first side; and
   the at least one of the metal x+1 layer power interconnect or the metal x−1 layer power interconnect of the second IO pad and the first metal x layer power interconnect of the first TO pad connect at a corner of the first side and the second side.

5. The MOS device of claim 4, wherein the connection between the at least one of the metal x+1 layer power interconnect or the metal x−1 layer power interconnect of the second IO pad and the first metal x layer power interconnect of the first IO pad forms a 90° connection.

6. The MOS device of claim 1, wherein the first IO pad and the second IO pad are identical and have a same orientation within the IO pad ring.

7. The MOS device of claim 1, further comprising a plurality of additional IO pads, the additional IO pads being located on each side of the IO pad ring including the first side and the second side, each of the first IO pad, the second IO pad, and the additional IO pads being identical and having a same orientation within the IO pad ring.

8. The MOS device of claim 7, wherein each IO pad located on the first side is located between the core of the MOS device and a first external outer edge, and wherein a pair of IO pads are located on the second side, the pair of IO pads located between the core of the MOS device and a second external outer edge, one IO pad of the pair of IO pads located adjacent to the core of the MOS device, one IO pad of the pair of IO pads located adjacent the second external outer edge.

* * * * *